United States Patent
Maeda

(10) Patent No.: US 7,142,060 B1
(45) Date of Patent: Nov. 28, 2006

(54) ACTIVE SPLITTER FOR MULTIPLE RECEPTION UNITS

(75) Inventor: Ryuji Maeda, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 26 days.

(21) Appl. No.: 10/750,989

(22) Filed: Dec. 31, 2003

(51) Int. Cl.
*H03F 3/68* (2006.01)

(52) U.S. Cl. ............... 330/295; 330/51; 330/124 D

(58) Field of Classification Search ............ 330/295, 330/51, 124 D, 10, 207 A
See application file for complete search history.

(56) References Cited

U.S. PATENT DOCUMENTS

| | | | | |
|---|---|---|---|---|
| 3,978,422 A | * | 8/1976 | Rheinfelder | 330/132 |
| 4,164,714 A | * | 8/1979 | Swanson | 330/10 |
| 5,072,199 A | * | 12/1991 | Furlow | 333/124 |
| 5,546,050 A | * | 8/1996 | Florian et al. | 330/282 |
| 5,559,472 A | * | 9/1996 | Kobayashi | 330/293 |
| 5,986,500 A | * | 11/1999 | Park et al. | 330/124 D |
| 6,160,447 A | * | 12/2000 | Huang | 330/124 D |
| 6,463,269 B1 | * | 10/2002 | DeMarco | 455/341 |
| 6,577,198 B1 | * | 6/2003 | Bayruns | 330/295 |
| 6,586,996 B1 | * | 7/2003 | Fanous et al. | 330/254 |
| 6,674,325 B1 | * | 1/2004 | Chen et al. | 330/124 D |
| 6,900,695 B1 | * | 5/2005 | Ouacha | 330/295 |

* cited by examiner

*Primary Examiner*—Patricia Nguyen
(74) *Attorney, Agent, or Firm*—The Eclipse Group LLP

(57) ABSTRACT

An active splitter is disclosed for splitting an input signal into a plurality of split output signals. The active splitter may include a plurality of active circuits connected in parallel that produce the plurality of split output signals from the received input signal, where each active circuit of the plurality of active circuits produces a corresponding split output signal from the plurality of split output signals that is substantially similar to the received input signal.

70 Claims, 12 Drawing Sheets

US 7,142,060 B1

ACTIVE SPLITTER FOR MULTIPLE RECEPTION UNITS

BACKGROUND OF THE INVENTION

1. Field of the Invention

This invention relates generally to power signal splitters and in particular to active power signal splitters.

2. Related Art

From the inception of convenient cable television ("CATV") and direct broadcast satellite ("DBS") services such as those provided by DBS service providers DirectTV® and DISH Network® in the United States and similar services around the world, there has been a tremendous growth in the number of subscribers. As more subscribers enroll for both CATV and DBS services, the CATV and DBS service providers are offering a greater number of services including, but not limited to, additional pay-per view, digital cable transmissions, high definition television ("HDTV"), set-top-box with multiple outputs, broadband Internet, digital music transmissions, satellite radio transmission, personal video recorder ("PVR"), and other bandwidth-intensive services.

Typically, once a subscriber enrolls for either CATV or DBS services, a CATV or DBS service provider connects the subscriber, as shown by the system 100 in FIG. 1, to a CATV (not shown) or DBS network (not shown) via a transmission line 102 (such as a shield-pair transmission line generally known as a "coaxial cable" or optical transmission line such as fiber optic cable) and a satellite 104 communication link 106 utilizing a satellite antenna 108 (such as an active and/or passive array antenna or reflector antenna typically known as a "dish" antenna). The input signals 110 and 112 produced by either the transmission line 102 or satellite antenna 108 are typically input to a set-top box 114 ("STB") that may be connected to a plurality of output devices including a video monitor 116 (such as a television set), video recorder 118 (such a VCR, DVR, recordable DVD, PVR or other similar type devices) and/or broadband modem 120 of the subscriber. The video monitor 116 may include one or more reception units (such as tuners) such as first tuner 122 and second tuner 124 where the second tuner 124 may be utilized for picture-in-picture ("PIP") applications. It is appreciated by those skilled in the art that the video monitor 116 may also include the STB 114, video recorder 118 and/or broadband modem 120. It is also appreciated by those skilled in the art that if the STB 114 is integrated into the video monitor 116, the STB 114 may include the first tuner 122 and second tuner 124, and that the STB 114 may also be capable of receiving regular "off the air" television signals (i.e., terrestrial in the case that the transmission line 102 is connected to external "off the air" antenna), CATV and DBS signals, or a combination.

As a result, in both CATV and DBS systems it is desirable to split the input signal (input signal 110 for a CATV system and input signal 112 for a DBS system) for use by more than one portion of the system 100. However, a simple splitting of the input signal into multiple output signal paths without applying gain results in a power loss that is proportional to number of times the input signal is split. Therefore, in order to not degrade the noise performance of the system 100, the splitter (not shown) within the STB 114 should be matched to the impedances of the output devices, have low insertion loss, have low noise-figure (NF), and provide high isolation between all the input and output ports.

In FIG. 2, a prior art example implementation of a system 200 is shown for splitting an input signal 202 from either input signal 110 or input signal 112 shown in FIG. 1. The system 200, FIG. 2, may include a splitter 204 in signal communication with a plurality of reception units of which, for example purposes, four reception units (tuners 206, 208, 210 and 212) are shown connected to the splitter 204 via split signal paths 214, 216, 218 and 220, respectively.

While FIG. 1 showed the STB 114 connected to a plurality of reception units within external devices, it is appreciated by those skilled in the art that as a result of the CATV and DBS service providers (not shown) offering a variety of services to subscribers, a STB for digital and/or analog cable, terrestrial, or satellite reception may typically utilize a multiple number of reception units within the STB. As an example, the tuners 206, FIG. 2, 208, 210 and 212 may produce outputs 222, 224, 226 and 228, respectively, that may be passed to video monitor 116, FIG. 1, video recorder 118 and broadband modem 120, respectively. Therefore, the system 200, FIG. 2, may be either external or internal to the STB 114 of FIG. 1.

Typically, at present the splitter 204, FIG. 2, is usually implemented as a passive splitter utilizing passive elements such as numerous resistors or a set of transformers. As an example, the splitter 204 may be implemented utilizing a Wilkinson divider or cascaded passive network of Wilkinson type. Unfortunately, the use of a passive splitter degrades the overall performance of the tuners 206, 208, 210 and 212 because the passive splitters will cause insertion losses of between approximately 3 to 6 decibels ("dB") per split, which degrades the performance of the associated tuners by affecting the overall noise figure and signal-to-noise ratio ("SNR") of the system 200.

In FIG. 3, another prior art example implementation of a system 300 utilizing a low-nose amplifier 302 ("LNA") for potentially improved performance over the system 100 shown in FIG. 1. The system 300 may include the LNA 302 and a passive splitter 304 in signal communication with a plurality of reception units of which, for example purposes, four reception units (tuners 306, 308, 310 and 312) are shown connected to the splitter 304 via split signal paths 314, 316, 318 and 320, respectively.

Again, it is appreciated by those skilled in the art that the four tuners 306, 308, 310 and 312 may be included within the STB 114, FIG. 1, and may produce outputs 322, FIG. 3, 324, 326 and 328, respectively, that may be passed to video monitor 116, FIG. 1, video recorder 118 and broadband modem 120, respectively.

In this example implementation, the low-noise stage LNA 302 may be placed prior to signal splitting at passive splitter 304. The LNA 302 receives an input signal 330 (from input signals 110, FIG. 1, and 112 produced by either the transmission line 102 or satellite antenna 108) and amplifies and passes it to the passive splitter 304, FIG. 3, via signal path 332. If the LNA 302 has sufficient gain and low noise figure, it may help reduce some of the noise degradation of the system 300 caused by the passive splitter 304.

However, it is appreciated by those skilled in the art that, unfortunately, placing a gain stage, such as LNA 302, before splitting the input signal 330 with passive splitter 304 typically increases implementation complexity and causes poor isolation between the split paths (i.e., the output ports of the passive splitter 304) via split signal paths 314, 316, 318 and 320.

Therefore, there is a need for a system and method that improves upon the performance of current known splitters so that splitting an input signal into multiple split signals does not significantly degrade the overall performance of the system.

SUMMARY

An active splitter is disclosed for splitting an input signal into a plurality of split output signals. The active splitter may include a plurality of active circuits connected in parallel that produce the plurality of split output signals from the received input signal, where each active circuit of the plurality of active circuits produces a corresponding split output signal from the plurality of split output signals that is substantially similar to the received input signal.

The active splitter may further include a controller that is in signal communication with the plurality of active circuits for controlling the electrical characteristics of the plurality of active circuits. Additionally, the active splitter may include a first gain stage in signal communication with the plurality of active circuits, where the first gain stage receives the received input signal, produces an amplified signal from the received input signal, and passes the amplified signal to the plurality of active circuits.

In operation, the active splitter performs a method that splits the input signal into a plurality of output signals. The method may include receiving the input signal with a plurality of voltage followers connected in parallel. The plurality of voltage followers then produces the plurality of output signals, where each voltage follower of the plurality of voltage followers produces a corresponding output signal of the plurality of output signals. The output signals will be substantially similar to the input signal.

The method performed by the active splitter may further include determining the output values produced by the followers with a controller and comparing the output values produced by the followers with the input signal to the followers. Additionally, the method may further include adjusting the amplification of the input signal with the controller based on the comparison of the output values produced by the followers and the input signal to the followers.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
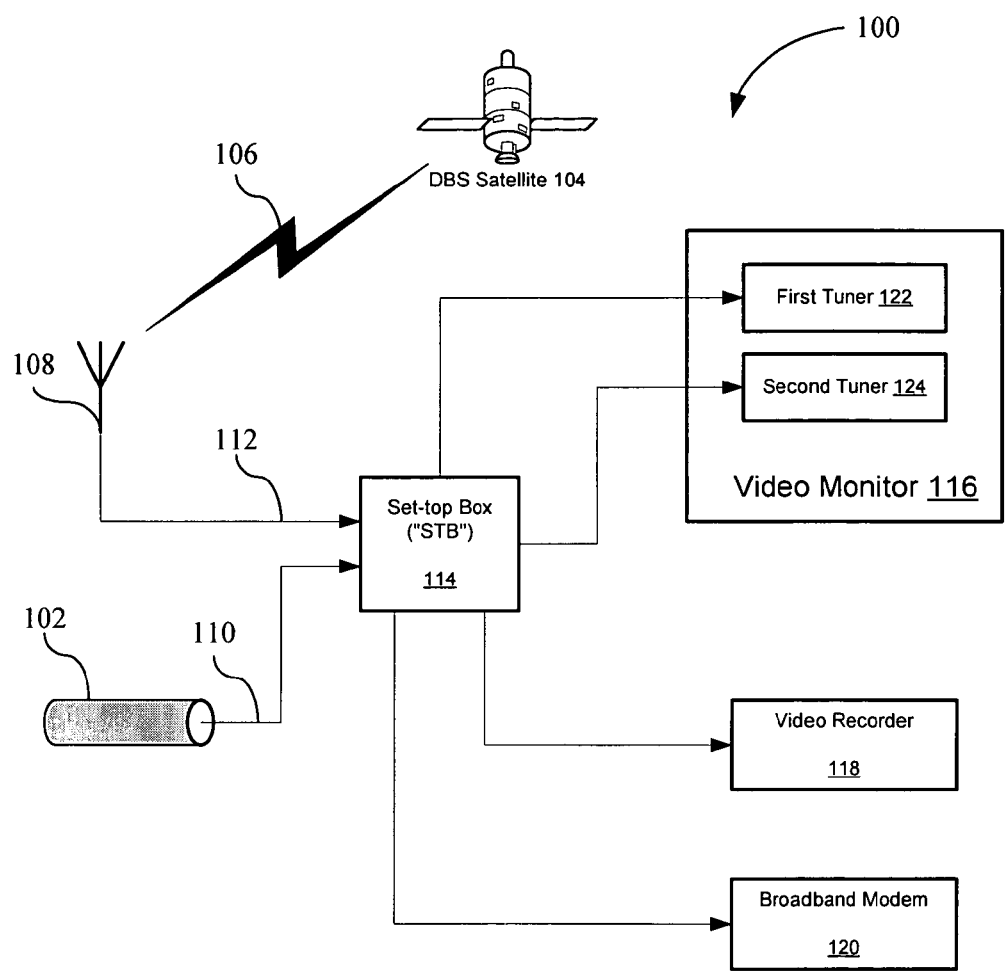
FIG. 1 is a block diagram of prior art system for receiving either CATV or DBS services at a plurality of reception units.
Figure 2:
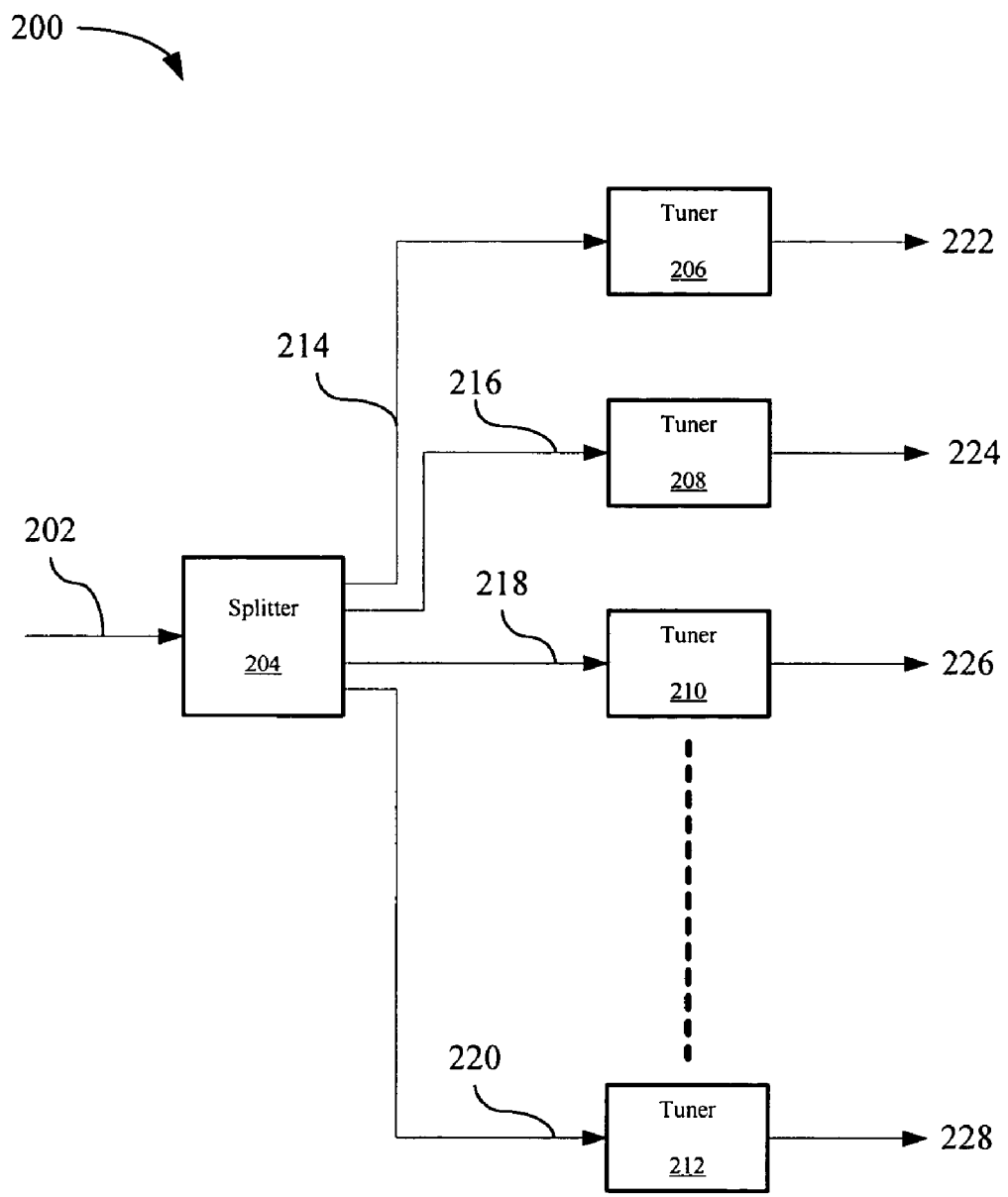
FIG. 2 is a block diagram of a prior art example implementation of a system for splitting the input signals shown in FIG. 1 with a passive splitter.
Figure 3:
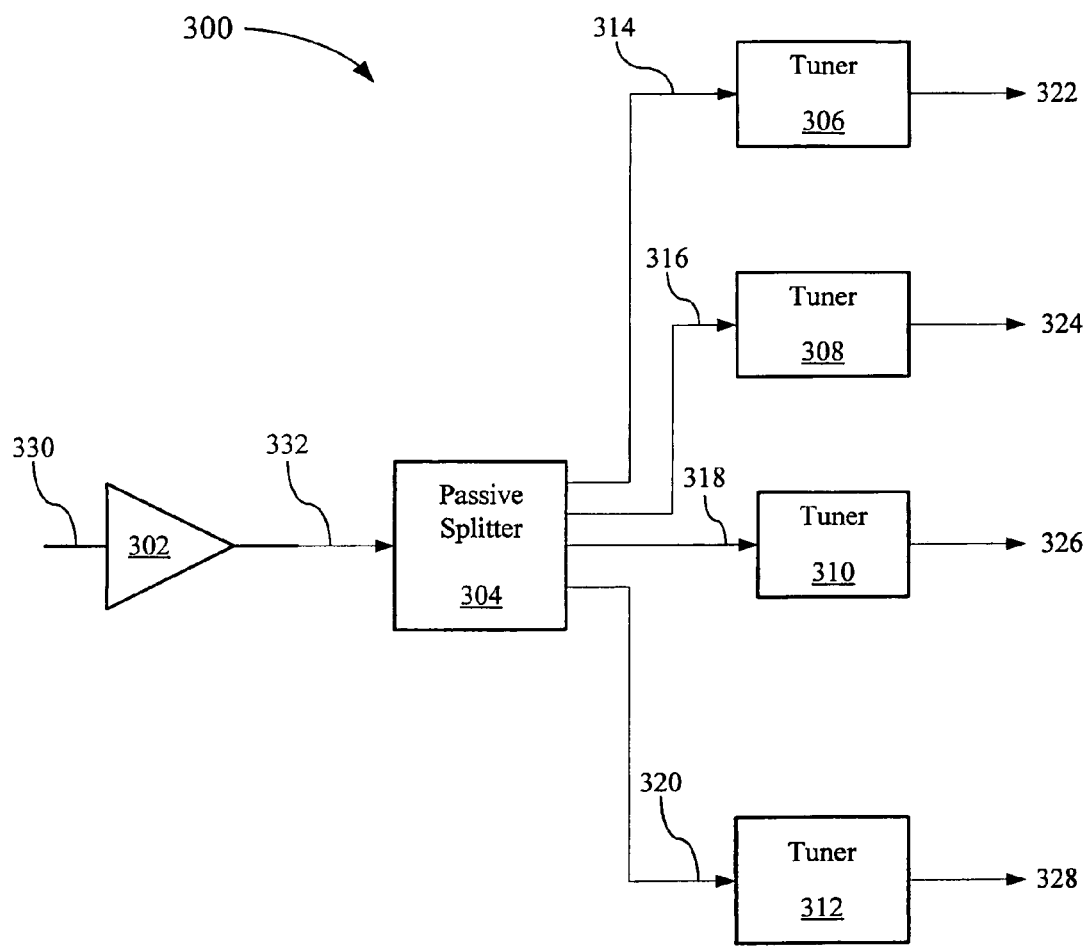
FIG. 3 is a block diagram of another prior art example implementation of a system for splitting the input signals shown in FIG. 1 with a passive splitter in combination with an amplifier.
Figure 4:
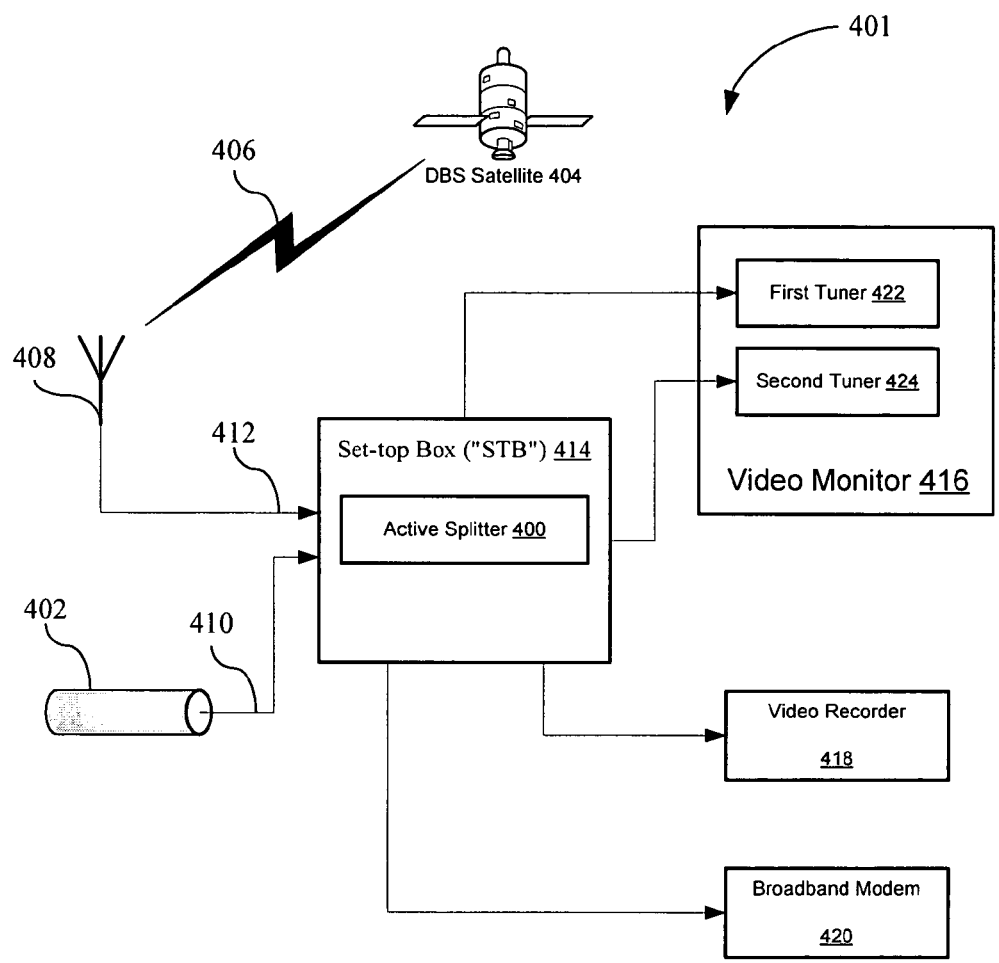
FIG. 4 is a block diagram of an example implementation of an Active Splitter with a CATV or DBS system for receiving either CATV or DBS services at a plurality of reception units.

This invention discloses an Active Splitter that splits an input signal into multiple split signals without significant system performance degradation. In FIG. 4, a block diagram of an example implementation of an Active Splitter 400 with a cable television ("CATV") or direct broadcasting satellite ("DBS") system 401 for receiving either CATV or DBS services at a plurality of reception units is shown.

Again, once a subscriber enrolls for either CATV or DBS services, a CATV or DBS service provider connects the subscriber, as shown by the system 401 to a CATV (not shown) or DBS network (not shown) via a transmission line 402 (such as a shield-pair transmission line generally known as a "coaxial cable" or optical transmission line such as fiber optic cable) or a satellite 404 communication link 406 utilizing a satellite antenna 408 (such as an active and/or passive array antenna or reflector antenna typically known as a "dish" antenna), respectively. The input signals 410 and 412 produced by either the transmission line 402 or satellite antenna 408 are typically input to a set-top box 414 ("STB") that may be connected to a plurality of output devices including a video monitor 416 (such as a television set), video recorder 418 and/or broadband modem 420 of the subscriber. The video monitor 416 may include one or more reception units (such as tuners) such as first tuner 422 and second tuner 424 where the second tuner 424 may be utilized for picture-in-picture ("PIP") applications. In the case of a DBS system, the STB 414 may be an integrated receiver and decoder ("IRD"). It is appreciated by those skilled in the art that the video monitor 416 may also include the STB 414, video recorder 418 and/or broadband modem 420. It is also appreciated by those skilled in the art that if the STB 414 is integrated into the video monitor 416, the STB 414 may include the first tuner 422 and second tuner 424, and that the STB 414 may also be capable of receiving regular "off the air" television signals (i.e., terrestrial in the case that the transmission line 402 is connected to external "off the air" antenna), CATV and DBS signals, or a combination.

Figure 5:
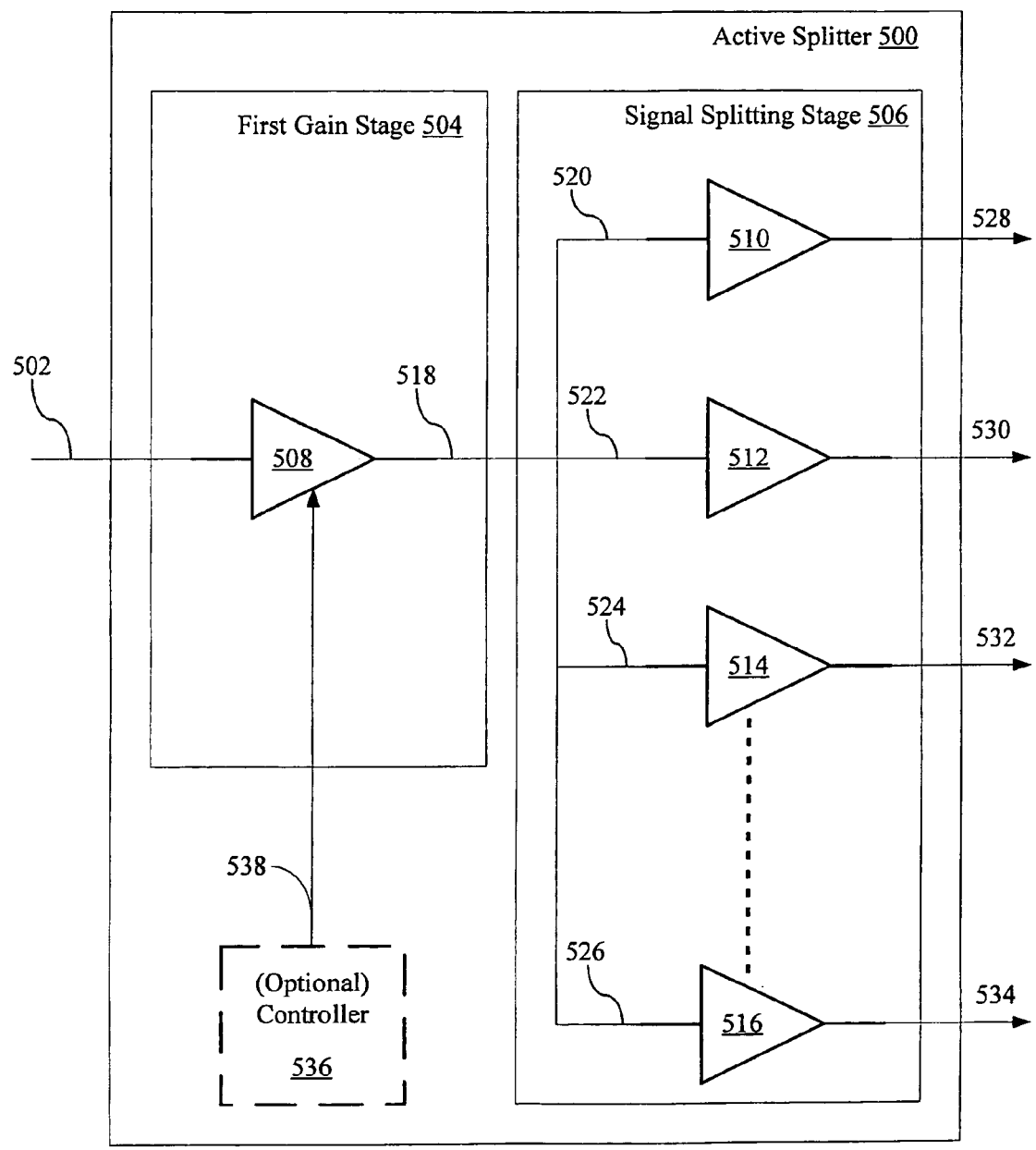
FIG. 5 is a block diagram of an example implementation of an Active Splitter for splitting the input signals shown in FIG. 4.

In FIG. 5, an example implementation of the Active Splitter 500 is shown for splitting an input signal 502 from either input signal 410 or input signal 412 shown in FIG. 4. The Active Splitter 500 may include an architecture having a first gain stage 504 and a subsequent signal splitting stage 506. The first gain stage 504 may include an active circuit, such as a first stage low-noise amplifier 508 ("LNA"), and the signal splitting stage 506 may include multiple active circuits (such as multiple LNAs). As an example, the signal splitting stage may include four signal splitting stage active circuits 510, 512, 514 and 516 connected in parallel; however, it is appreciated that four active circuits is only exemplary and that any multiple number of active circuits could be implemented without limitation or departing from the spirit of the invention.

It is appreciated that the Active Splitter 500 may include passive components (not shown) as well as additional active circuits (not shown) between the first gain stage 504 and the signal splitting stage 506, or later stages (not shown) to further improve the electrical characteristics of the Active Splitter 500. Additionally, the first stage LNA 508 may be implemented utilizing a common-emitter amplifier or common-source amplifier. Similarly, the signal splitting stage active circuits 510, 512, 514 and 516 may also be implemented utilizing emitter-follower circuits, source-follower circuits, or other similar circuits with similar electrical characteristics such as Darlington type circuits.

As a general operational description of the exemplary implementation of the architecture, the Active Splitter 500 receives the input signal 502 from either input signal 410, FIG. 4, or input signal 412 and amplifies the input signal 502, FIG. 5, with LNA 508. The LNA 508 passes the amplified signal 518 to the four signal splitting stage active circuits 510, 512, 514 and 516, via signal paths 520, 522, 524 and 526, respectively. The individual signal splitting stage active circuits 510, 512, 514 and 516 then process the received split signals and produce split output signals 528, 530, 532 and 534, respectively. The individual signal splitting stage active circuits 510, 512, 514 and 516 may be common-collector amplifiers (also known as "emitter followers") that may act as a "buffer" of the split signal on signal paths 520, 522, 524 and 526 from the split output signals 528, 530, 532 and 534.

The Active Splitter 500 may also be dynamic or programmable with the assistance of a controller 536 that may be any microcontroller or microprocessor capable of either being hardwired or running software (not shown) that may be resident on the microprocessor, the Active Splitter 500 or a device external to the Active Splitter 500. In an example implementation of an Active Splitter 500 with a controller 536, the Active Splitter 500 may have circuitry (not shown) capable of determining the output values of the four signal splitting stage active circuits 510, 512, 514 and 516. If the LNA 508 is implemented as a variable gain amplifier LNA ("VGA-LNA"), the controller 536 could then adjust the amount of gain produced by the VGA-LNA 508 by sending control signals via signal path 538. The controller 536 could then adjust the gain produced by the VGA-LNA 508 in response to the outputs of the four signal splitting stage active circuits 510, 512, 514 and 516 being below a certain predetermined signal strength.

Figure 6:
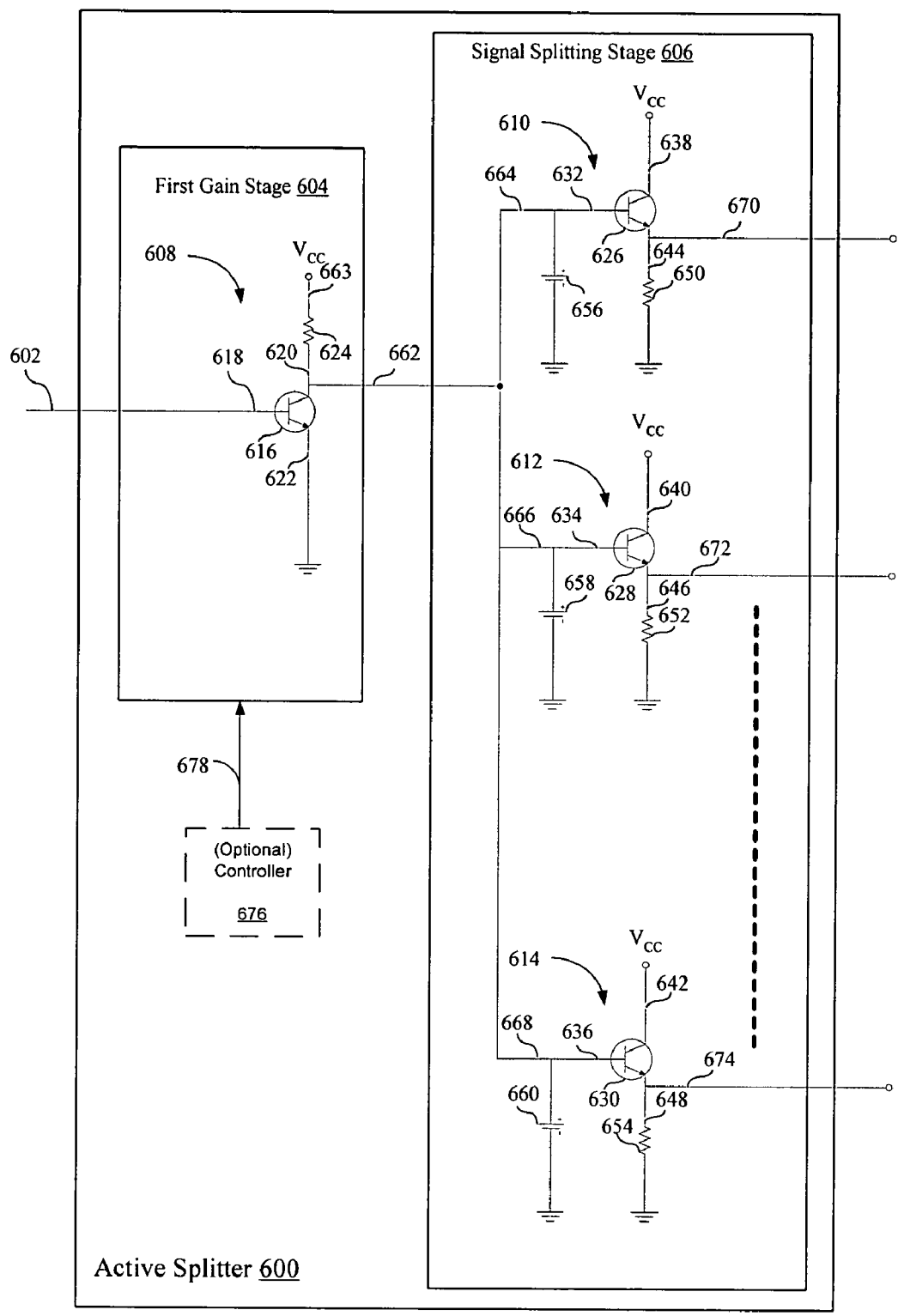
FIG. 6 is a block diagram of another example implementation of the Active Splitter for splitting the input signals shown in FIG. 4 utilizing common-emitter amplifiers and emitter followers with bipolar transistors.

In FIG. 6, another example implementation of the Active Splitter 600 is shown for splitting an input signal 602 from either input signal 410 or input signal 412 shown in FIG. 4 utilizing a common-emitter amplifier and a plurality of emitter followers. The Active Splitter 600, FIG. 6, may include an architecture having a first gain stage 604 and a subsequent signal splitting stage 606. The first gain stage 604 may include an active circuit, such as a first stage LNA, and the signal splitting stage 606 may include multiple active circuits. As an example the first gain stage 604 LNA may include a common-emitter amplifier 608 and the signal splitting stage 606 may include a plurality of emitter followers. As an example, the signal splitting stage may include three emitter followers 610, 612 and 614 connected in parallel; however, it is again appreciated that three emitter followers is only exemplary and that any multiple number of emitter followers could be implemented without limitation or departing from the spirit of the invention. Additionally, while the amplifiers shown are single ended amplifiers, it is appreciated by those skilled in the art that differential amplifiers may also be utilized without limitation or departing from the spirit of the invention.

It is also appreciated that the Active Splitter 600 may include passive components (not shown) as well as additional active circuits (not shown) between the first gain stage 604 and the signal splitting stage 606, or later stages (not shown) to further improve the electrical characteristics of the Active Splitter 600.

As an example, the common-emitter amplifier 608 may include an npn bipolar transistor 616, a base 618, collector 620, emitter 622 and collector resistor 624. It is appreciated by those skilled in the art that there are a number of potential circuit topologies that may be utilized to implement the common-emitter amplifier 608 including using both npn and pnp type bipolar transistors.

For the purpose of illustration, a simple common-emitter amplifier 608 circuit topology is shown and it is appreciated that numerous other common-emitter amplifier circuit topologies may also be utilized without limitation or departing from the spirit of the invention. Similarly, the three emitter followers 610, 612 and 614 within the signal splitting stage 606 may include npn bipolar transistors 626, 628, and 630, bases 632, 634, and 636, collectors 638, 640 and 642, emitters 644, 646 and 648, emitter resistors 650, 652 and 654, and bias voltage sources 656, 658 and 660.

In an example operation, the common-emitter amplifier 608 receives the input signal 602 at the base 618 of the first transistor 616 while the emitter 622 is set to ground. As a result, the common-emitter amplifier 608 produces a first stage output voltage signal 662 by drawing current (not shown) from the $V_{CC}$ 663 source across the collector resistor 624 proportional to the base voltage at the base 618 of the first transistor 616. In this way, the first stage output voltage signal 662 is substantially similar to the input signal 602 amplified by the gain of the common-emitter amplifier 608. The first stage output voltage signal 662 is then passed to the three emitter followers 610, 612 and 614 as second stage input signals 664, 666 and 668, respectively. The emitter followers 610, 612 and 614 may act as "buffers" and thus not provide any significant voltage gain. However, the emitter followers 610, 612 and 614 may provide current or power gain while at the same time acting as impedance matching elements for any devices or loads (not shown) in signal communication with signal paths 670, 672 and 674 connected to emitters 644, 646 and 648, respectfully. In this case, the low output impedance looking into the emitters 644, 646 and 648 could match the low impedance loads in signal communication with signal paths 670, 672 and 674, thus buffering the first stage output voltage signal 662 from the low impedance loads (not shown).

Additionally, the emitter followers 610, 612 and 614 have high input impedance looking into transistor 626, 628 and 630 bases 632, 634 and 636, so connecting a plurality of emitter followers in parallel does not pull the first stage output voltage signal 662 and thus does not significantly affect the first gain stage 604. As a result of utilizing emitter followers, if the design of common-emitter amplifier 608 is such that the output impedance of the first gain stage 604 is closely matched to the input impedance of the signal splitting stage 606, the power loss associated with splitting the first stage output voltage signal 662 will be minimized allowing the Active Splitter 600 to potentially achieve optimum overall electrical performance because typically emitter followers have very good linearity and frequency response. Therefore, it is possible to implement the Active Splitter 600 with numerous cascading emitter followers with the first gain stage 604 because the numerous cascading emitter followers do not significantly degrade the overall performance of the first gain stage 604. Moreover, typical emitter followers may be implemented such that their output to input isolation is better than that of a common emitter amplifier. Therefore, the Active Splitter 600 is capable of achieving superior output port-to-port isolation in comparison to potential solutions that utilize a common emitter splitting stage.

It is appreciated by those skilled in the art that first gain stage 604 may also be implemented utilizing a voltage follower instead of the common-emitter amplifier 608 shown in the first gain stage 604 without limitation or departing from the spirit of the invention. In the case of a situation where the Active Splitter 600 will operate in an environment that has linearity requirements that are stringent, an emitter follower may be utilized instead of the common emitter amplifier 608.

The Active Splitter 600 may also be dynamic or programmable with the assistance of a controller 676 that may be any microcontroller or microprocessor capable of either being hardwired or running software (not shown) that may be resident on the microprocessor, the Active Splitter 600 or a device external to the Active Splitter 600. In an example implementation of an Active Splitter 600 with a controller 676, the Active Splitter 600 may have circuitry (not shown) capable of determining the output values of the emitter followers 610, 612 and 614. If the signal splitting stage 606 is implemented with additional components such that the signal splitting stage 606 is capable of operating as a VGA-LNA, the controller 676 could then adjust the amount of gain produced by the signal splitting stage 606 by sending control signals via signal path 678. The controller 676 could then adjust the gain produced by the signal splitting stage 606 in response to the outputs of the emitter followers 610, 612 and 614 being below a certain predetermined signal strength.

Figure 7:
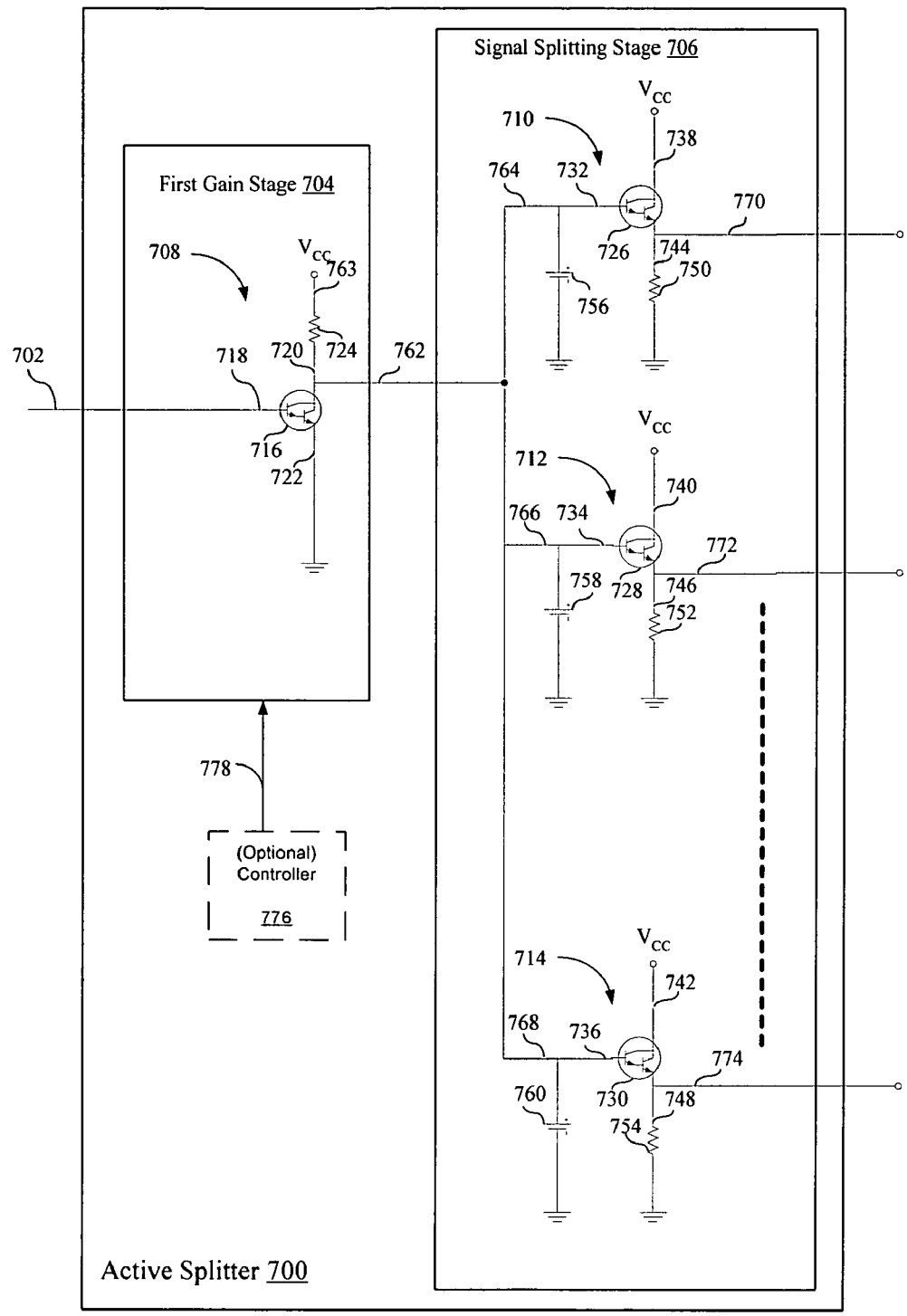
FIG. 7 is a block diagram of another example implementation of the Active Splitter for splitting the input signals shown in FIG. 4 utilizing a common-emitter amplifier and a plurality of emitter followers having Darlington pair transistors instead of standard bipolar transistors.

In FIG. 7, another example implementation of the Active Splitter 700 is shown for splitting an input signal 702 from either input signal 410 or input signal 412 shown in FIG. 4 utilizing a common-emitter amplifier and a plurality of emitter followers having Darlington pair transistors instead of standard bipolar transistors. Similar to FIG. 6, the Active Splitter 700, FIG. 7, may include an architecture having a first gain stage 704 and a subsequent signal splitting stage 706. The first gain stage 704 may include an active circuit, such as a first stage LNA, and the signal splitting stage 706 may include multiple active circuits. As an example the first gain stage 704 LNA may include a common-emitter amplifier 708 and the signal splitting stage 706 may include a plurality of emitter followers. As an example, the signal splitting stage may include three emitter followers 710, 712 and 714 connected in parallel; however, it is again appreciated that three emitter followers is only exemplary and that any multiple number of emitter followers could be implemented without limitation or departing from the spirit of the invention.

Again, it is also appreciated that the Active Splitter 700 may include passive components (not shown) as well as additional active circuits (not shown) between the first gain stage 704 and the signal splitting stage 706, or later stages (not shown) to further improve the electrical characteristics of the Active Splitter 700.

As an example, the common-emitter amplifier 708 may include a Darlington pair transistor 716, a base 718, collector 720, emitter 722 and collector resistor 724. It is appreciated by those skilled in the art that there are a number of potential circuit topologies that may be utilized to implement the common-emitter amplifier 708. Additionally, while the amplifiers shown are single ended amplifiers, it is appreciated by those skilled in the art that differential amplifiers may also be utilized without limitation or departing from the spirit of the invention.

For the purpose of illustration, a simple common-emitter amplifier 708 circuit topology is shown and it is appreciated that numerous other common-emitter amplifier circuit topologies may also be utilized without limitation or departing from the spirit of the invention. Similarly, the three emitter followers 710, 712 and 714 within the signal splitting stage 706 may include Darlington pair transistors 726, 728, and 730, bases 732, 734, and 736, collectors 738, 740 and 742, emitters 744, 746 and 748, emitter resistors 750, 752 and 754, and bias voltage sources 756, 758 and 760.

Similar to FIG. 6, in an example operation, the common-emitter amplifier 708 receives the input signal 702 at the base 718 of the first transistor 716 while the emitter 722 is set to ground. As a result, the common-emitter amplifier 708 produces a first stage output voltage signal 762 by drawing current (not shown) from the $V_{CC}$ 763 source across the collector resistor 724 proportional to the base voltage at the base 718 of the first transistor 716. In this way, the first stage output voltage signal 762 is substantially similar to the input signal 702 amplified by the gain of the common-emitter amplifier 708. The first stage output voltage signal 762 is then passed to the three emitter followers 710, 712 and 714 as second stage input signals 764, 766 and 768. The emitter followers 710, 712 and 714 may act as "buffers" and thus not provide any significant voltage gain. However, the emitter followers 710, 712 and 714 may provide current or power gain while at the same time acting as impedance matching elements for any devices or loads (not shown) in signal communication with signal paths 770, 772 and 774 connected to emitters 744, 746 and 748, respectfully. In this case, the low output impedance looking into the emitters 744, 746 and 748 could match the low impedance loads in signal communication with signal paths 770, 772 and 774, thus buffering the first stage output voltage signal 762 from that low impedance loads (not shown).

Additionally, the emitter followers 710, 712 and 714 have high input impedance looking into transistor 726, 728 and 730 bases 732, 734 and 736, so connecting a plurality of emitter followers in parallel does not pull the first stage output voltage signal 762 and thus does not significantly affect the first gain stage 704. As a result of utilizing emitter followers, if the design of common-emitter amplifier 708 is such that the output impedance of the first gain stage 704 is closely matched to the input impedance of the signal splitting stage 706, the power loss associated with splitting the first stage output voltage signal 762 will be minimized allowing the Active Splitter 700 to potentially achieve optimum overall electrical performance because typically emitter followers have very good linearity and frequency response. Therefore, it is possible to implement the Active Splitter 700 with numerous cascading emitter followers with the first gain stage 704 because the numerous cascading emitter followers do not significantly degrade the overall performance of the first gain stage 704. Moreover, typical emitter followers may be implemented such that their output to input isolation is better than that of a common emitter amplifier. Therefore, the Active Splitter 700 is capable of achieving superior output port-to-port isolation in comparison to potential solutions that utilizes a common emitter splitting stage.

Again, it is appreciated by those skilled in the art that the first gain stage 704 may also be implemented utilizing a voltage follower instead of the common-emitter amplifier 708 shown in the first gain stage 704 without limitation or departing from the spirit of the invention. In the case of a situation where the Active Splitter 700 will operate in an environment that has linearity requirements that are stringent, an emitter follower may be utilized instead of the common emitter amplifier 708.

Similar to FIG. 6, the Active Splitter 700 may also be dynamic or programmable with the assistance of a controller 776 that may be any microcontroller or microprocessor capable of either being hardwired or running software (not shown) that may be resident on the microprocessor, the Active Splitter 700 or a device external to the Active Splitter 700. In an example implementation of an Active Splitter 700 with a controller 776, the Active Splitter 700 may have circuitry (not shown) capable of determining the output values of the emitter followers 710, 712 and 714. If the signal splitting stage 706 is implemented with additional components such that the signal splitting stage 706 is capable of operating as a VGA-LNA, the controller 776 could then adjust the amount of gain produced by the signal splitting stage 706 by sending control signals via signal path 778. The controller 776 could then adjust the gain produced by the signal splitting stage 706 in response to the outputs of the emitter followers 710, 712 and 714 being below a certain predetermined signal strength.

Figure 8:
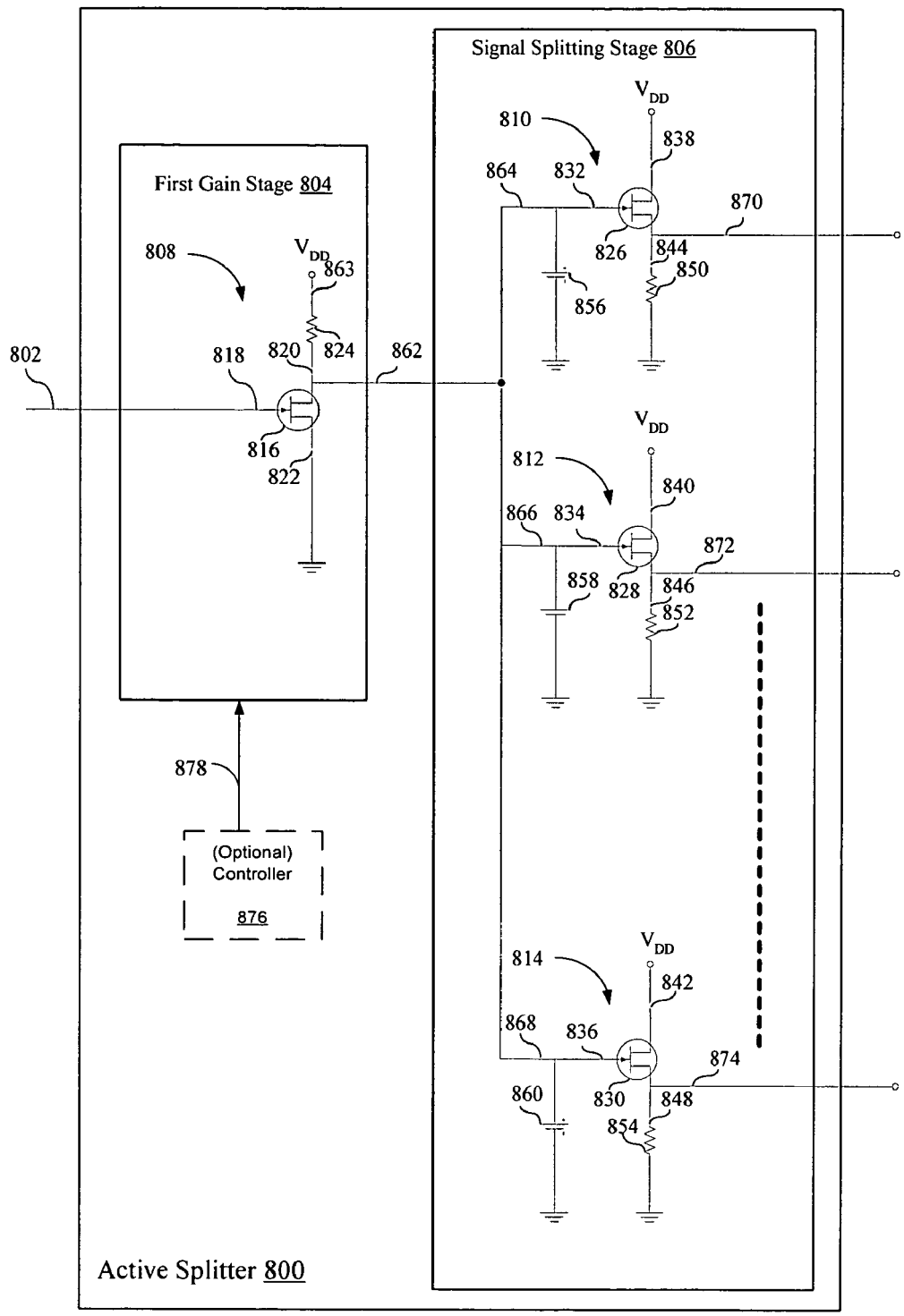
FIG. 8 is a block diagram of yet another example implementation of the Active Splitter for splitting the input signals shown in FIG. 4 utilizing common-source amplifiers and source followers.

In FIG. 8, yet another example implementation of the Active Splitter 800 is shown for splitting an input signal 802 from either input signal 410 or input signal 412 shown in FIG. 4 utilizing a common-source amplifier and a plurality of source followers. The Active Splitter 800, FIG. 8, may include an architecture having a first gain stage 804 and a subsequent signal splitting stage 806. The first gain stage 804 may include an active circuit, such as a first stage LNA, and the signal splitting stage 806 may include multiple active circuits. As an example the first gain stage 804 LNA may include a common-source amplifier 808 and the signal splitting stage 806 may include a plurality of source followers. As an example, the signal splitting stage may include three source followers 810, 812 and 814 connected in parallel; however, it is again appreciated that three source followers 810, 812 and 814 are only exemplary and that any multiple number of source followers could be implemented without limitation or departing from the spirit of the invention.

It is also appreciated that the Active Splitter 800 may include passive components (not shown) as well as additional active circuits (not shown) between the first gain stage 804 and the signal splitting stage 806, or later stages (not shown) to further improve the electrical characteristics of the Active Splitter 800.

As an example, the common-source amplifier 808 may include an n-type field effect transistor ("FET") 816, a gate 818, source 820, drain 822 and source resistor 824. It is appreciated by those skilled in the art that there are a number of potential circuit topologies that may be utilized to implement the common-source amplifier 808 including using both n-type and p-type type FETs, MOSFETs, CMOS, biCMOS and other similar semiconductors devices. Additionally, while the amplifiers shown are single ended amplifiers, it is appreciated by those skilled in the art that differential amplifiers may also be utilized without limitation or departing from the spirit of the invention.

For the purpose of illustration, a simple common-source amplifier 808 circuit topology is shown and it is appreciated that numerous other common-source amplifier circuit topologies may also be utilized without limitation or departing from the spirit of the invention. Similarly, the three source followers 810, 812 and 814 within the signal splitting stage 806 may include n-type FET transistors 826, 828, and 830, gates 832, 834, and 836, sources 838, 840 and 842, drains 844, 846 and 848, drain resistors 850, 852 and 854, and bias voltage sources 856, 858 and 860.

In an example operation, the common-source amplifier 808 receives the input signal 802 at the gate 818 of the first transistor 816 while the drain 822 is set to ground. As a result, the common-source amplifier 808 produces a first stage output voltage signal 862 by drawing current (not shown) from the $V_{DD}$ 863 source across the source resistor 824 proportional to the gate voltage at the gate 818 of the first transistor 816. In this way, the first stage output voltage signal 862 is substantially similar to the input signal 802 amplified by the gain of the common-source amplifier 808. The first stage output voltage signal 862 is then passed to the three source followers 810, 812 and 814 as second stage input signals 864, 866 and 868. The source followers 810, 812 and 814 may act as "buffers" and thus not provide any significant voltage gain. However, the source followers 810, 812 and 814 may provide current or power gain while at the same time acting as impedance matching elements for any devices or loads (not shown) in signal communication with signal paths 870, 872 and 874 connected to drains 844, 846 and 848, respectively. In this case, the low output impedance looking into the drains 844, 846 and 848 could match the low impedance loads in signal communication with signal paths 870, 872 and 874, thus buffering the first stage output voltage signal 862 from the low impedance loads (not shown).

Additionally, the source followers 810, 812 and 814 have high input impedance looking into transistor 826, 828 and 830 gates 832, 834 and 836, so connecting a plurality of source followers in parallel does not pull the first stage output voltage signal 862 and thus does not significantly affect the first gain stage 804. As a result of utilizing source followers, if the design of common-source amplifier 808 is such that the output impedance of the first gain stage 804 is closely matched to the input impedance of the signal splitting stage 806, the power loss associated with splitting the first stage output voltage signal 862 will be minimized allowing the Active Splitter 800 to potentially achieve optimum overall electrical performance because typically source followers have very good linearity and frequency response. Therefore, it is possible to implement the Active Splitter 800 with numerous cascading source followers with the first gain stage 804 because the numerous cascading source followers do not significantly degrade the overall linearity of the first gain stage 804. Moreover, typical source followers may be implemented such that their output to input isolation is better than that of a common source amplifier. Therefore, the Active Splitter 800 is capable of achieving superior output port-to-port isolation in comparison to potential solutions that utilizes a common source splitting stage.

It is appreciated by those skilled in the art that first gain stage 804 may also be implemented utilizing a voltage follower instead of the common-source amplifier 808, shown in the first gain stage 804 without limitation or departing from the spirit of the invention. In the case of a situation where the Active Splitter 800 will operate in and environment that has linearity requirements that are stringent, a source follower may be utilized instead of the common source amplifier 808.

Again similar to FIG. 6, the Active Splitter 800 may also be dynamic or programmable with the assistance of a controller 876 that may be any microcontroller or microprocessor capable of either being hardwired or running software (not shown) that may be resident on the microprocessor, the Active Splitter 800 or a device external to the Active Splitter 800. In an example implementation of an Active Splitter 800 with a controller 876, the Active Splitter 800 may have circuitry (not shown) capable of determining the output values of the source followers 810, 812 and 814. If the signal splitting stage 806 is implemented with additional components such that the signal splitting stage 806 is capable of operating as a VGA-LNA, the controller 876 could then adjust the amount of gain produced by the signal splitting stage 806 by sending control signals via signal path 878. The controller 876 could then adjust the gain produced by the signal splitting stage 806 in response to the outputs of the source followers 810, 812 and 814 being below a certain predetermined signal strength.

Figure 9:
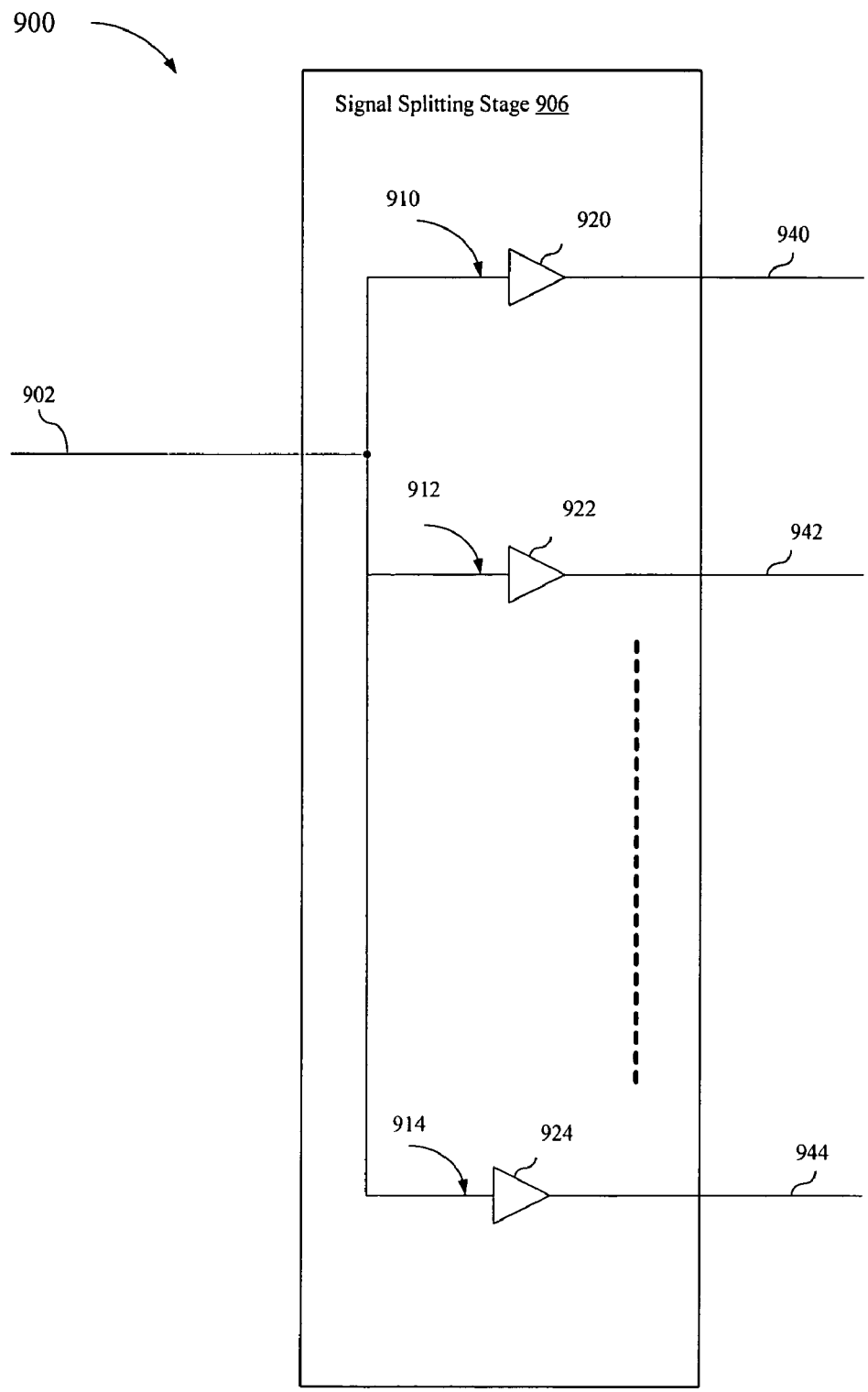
FIG. 9 is a block diagram of yet another example implementation of the Active Splitter that does not utilize a first gain stage.

In FIG. 9, an example implementation of the Active Splitter 900 is shown for splitting an input signal 902 from either input signal 410 or input signal 412 shown in FIG. 4. The Active Splitter 900 does not include a first gain stage. As an example, the signal splitting stage may include three signal splitting stage active circuits 910, 912, and 914 connected in parallel; however, it is appreciated that three active circuits are only exemplary and that any multiple number of active circuits could be implemented without limitation or departing from the spirit of the invention.

As a general operational description of the exemplary implementation of the architecture, the Active Splitter 900 receives the input signal 902 from either input signal 410, FIG. 4, or input signal 412, and passes the input signal 902 directly to the three signal splitting stage active circuits 920, 922, and 924, via signal paths 910, 912, and 914, respectively. The individual signal splitting stage active circuits 920, 922, and 924 then process the received split signals and produce split output signals 940, 942, and 944, respectively.

Figure 10:
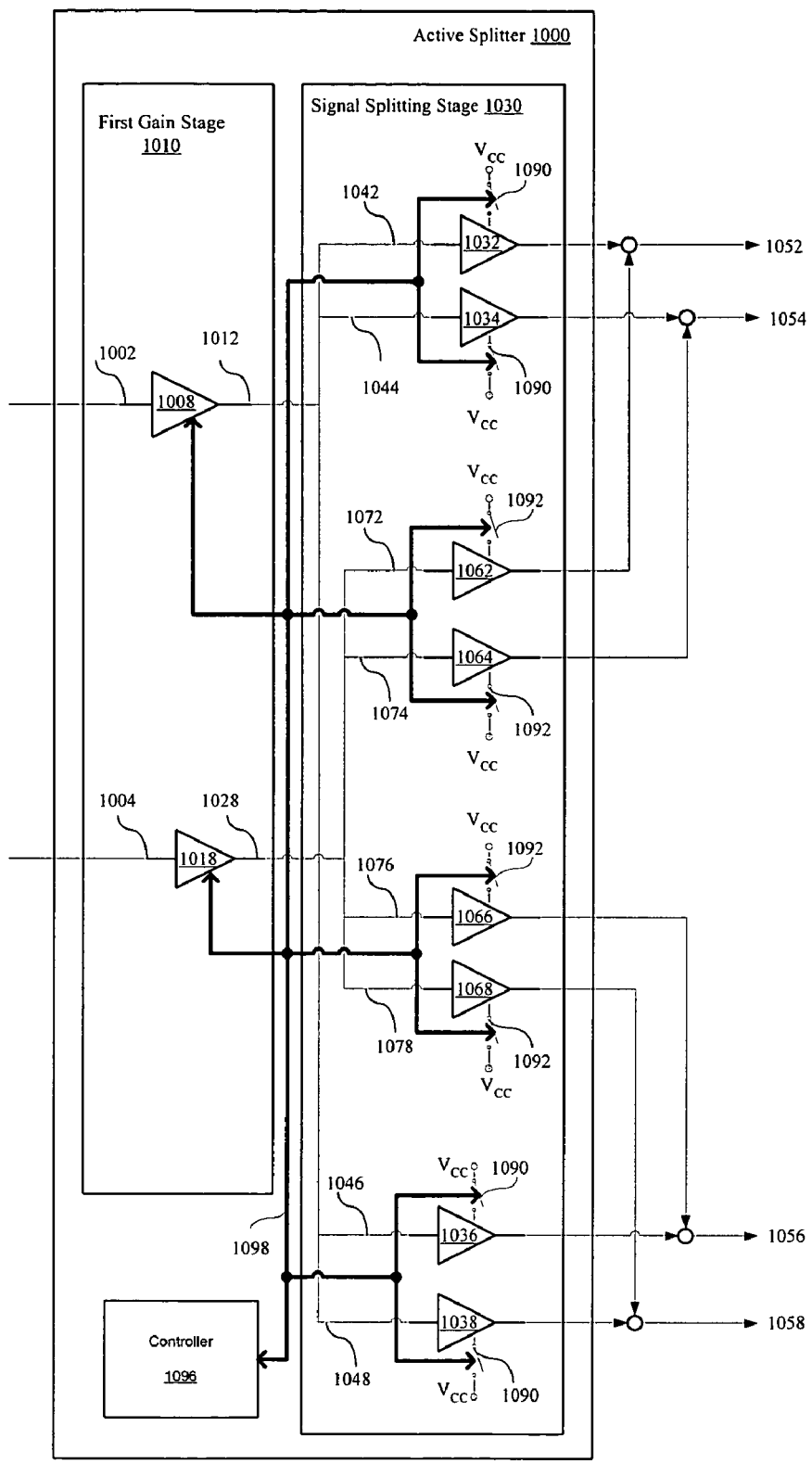
FIG. 10 is a block diagram of yet another example implementation of the Active Splitter for splitting the input signals shown in FIG. 4 utilizing a controller to power up/down the circuit blocks (as well as by activating switches on and off) to form the desired signal distribution path(s) from the input(s) to the output(s).

In FIG. 10, an example implementation of the Active Splitter 1000 is shown for distributing input signals 1002 and 1004 from either input signal 410 or input signal 412 shown in FIG. 4. The Active Splitter 1000 may include an architecture having a first gain stage 1010 and a subsequent signal splitting stage 1030. The first gain stage 1010 may include active circuits, such as first stage LNAs 1008 and 1018, and the signal splitting stage 1030 may include multiple active circuits (such as multiple followers). As an example, the signal splitting stage 1030 may include four signal splitting stage active circuits 1032, 1034, 1036 and 1038 connected in parallel, and four additional signal splitting stage active circuits 1062, 1064, 1066 and 1068 connected in parallel; however, it is appreciated that the number of active circuits is only exemplary and that any multiple number of active circuits could be implemented without limitation or departing from the spirit of the invention.

It is also appreciated that the Active Splitter 1000 may include passive components (not shown) as well as additional active circuits (not shown) between the first gain stage 1010 and the signal splitting stage 1030, or later or preceding stages (not shown) to further improve the electrical characteristics of the Active Splitter 1000. Additionally, the first stage LNAs 1008 and 1018 may be implemented utilizing a common-emitter amplifier or common-source amplifier. Similarly, the signal splitting stage active circuits 1032, 1034, 1036 and 1038, and 1062, 1064, 1066 and 1068 may also be implemented utilizing emitter-follower circuits, source-follower circuits, or other similar circuits with similar electrical characteristics such as Darlington type circuits. It is still further appreciated that the Active Splitter 1000 may not include any active components in the first stage 1010 such that the Active Splitter 1000 would implemented in a fashion similar to FIG. 9.

As a general operational description of the exemplary implementation of the architecture, the Active Splitter 1000 receives the input signals 1002 and 1004 from either input signal 410, FIG. 4, or input signal 412 and amplifies the input signal 1002 and 1004, with LNA 1008 and/or LNA 1018. The controller 1096 then selects the appropriate blocks by powering up/down the circuit blocks (as well as by activating switches 1090 and/or 1092, if there are any, to the "ON" and/or "OFF" positions) to form the desired signal distribution path(s) from the input(s) to the output(s). It is appreciated that the switches 1090 and 1092 may be implemented utilizing FET transistors (not shown).

As an example, switches 1090 may activate splitting stage active circuits 1032, 1034, 1036 and 1038 and switches 1092 may activate splitting stage active circuits 1062, 1064, 1066 and 1068. If activated by the controller 1096 via switches 1090, the LNA 1008 passes the amplified signal 1012 to the four signal splitting stage active circuits 1032, 1034, 1036 and 1038, via signal paths 1042, 1044, 1046 and 1048, respectively. The individual signal splitting stage active circuits 1032, 1034, 1036 and 1038 then process the received split signals and produce split output signals 1052, 1054, 1056 and 1058, respectively.

If activated by the controller 1096 via switches 1092, the LNA 1018 passes the amplified signal 1028 to the four signal splitting stage active circuits 1062, 1064, 1066 and 1068, via signal paths 1072, 1074, 1076 and 1078, respectively. The individual signal splitting stage active circuits 1062, 1064, 1066 and 1068 then process the received split signals and produce split output signals 1052, 1054, 1056 and 1058, respectively. Again, the controller 1096 may power up/down any of the eight signal splitting stage active circuits. The individual signal splitting stage active circuits 1032, 1034, 1036 and 1038, and 1062, 1064, 1066 and 1068, may be common-collector amplifiers (also known as "emitter followers") that may act as a "buffer" for the split signal on signal paths 1042, 1044, 1046 and 1048, and 1072, 1074, 1076 and 1078, respectively.

Other than powering up and down active circuit stages, the electrical characteristics (such as gain, linearity, or frequency response) of the Active Splitter 1000 may also be dynamic or programmable with the assistance of a controller 1096 that may be any microcontroller or microprocessor capable of either being hardwired or of running software (not shown) that may be resident on the microprocessor, the Active Splitter 1000 or a device external to the Active Splitter 1000. In an example implementation of an Active Splitter 1000 with a controller 1096, the Active Splitter 1000 may have circuitry (not shown) capable of determining the output values of the four signal splitting stage active circuits 1032, 1034, 1036 and 1038, or 1062, 1064, 1066 and 1068, as the case may be. If the LNAs 1008 and 1018 are implemented as variable gain amplifier LNAs ("VGA-LNA"), the controller 1096 may then adjust the amount of gain produced by the VGA-LNAs 1008 and 1018 by sending control signals via signal path 1098. The controller 1096 may then adjust the gain produced by the VGA-LNAs 1008 and 1018, respectively, in response to the outputs of the four signal splitting stage active circuits 1032, 1034, 1036 and 1038, and the outputs of the four signal splitting stage active circuits 1082, 1084, 1086 and 1088, being below a certain predetermined signal strength. Additionally, the controller 1096 could then either adjust the amount of gain produced by the signal splitting stage active circuits 1032, 1034, 1036, 1038, 1062, 1064, 1066, and 1068 or alternatively switching "ON" or "OFF" the signal splitting stage active circuits 1032, 1034, 1036 and 1038 via switches 1090 and signal splitting stage active circuits 1062, 1064, 1066, and 1068 via switches 1092 by sending control signals via signal path 1098.

It is appreciated that by those skilled in the art that active switch 1000 described in FIG. 10 may be implemented within a DBS multi-switch system and the control signals communicated via signal path 1098 (which may be implemented as a standard communication bus) may utilize, for example, a communication protocol such as the Digital Satellite Equipment Control System known as "DiSEqC™." DiSEqC™ is a well-known protocol that communicates on a communication bus between satellite receivers and peripheral equipment using only an existing coaxial cable. DiSEqC™ is a protocol that allows satellite receivers to both switch between multiple low-noise block downconverters ("LNBs") connected to the satellite receiver, via a coaxial cable, and change an LNB's individual polarization state.

Figure 11:
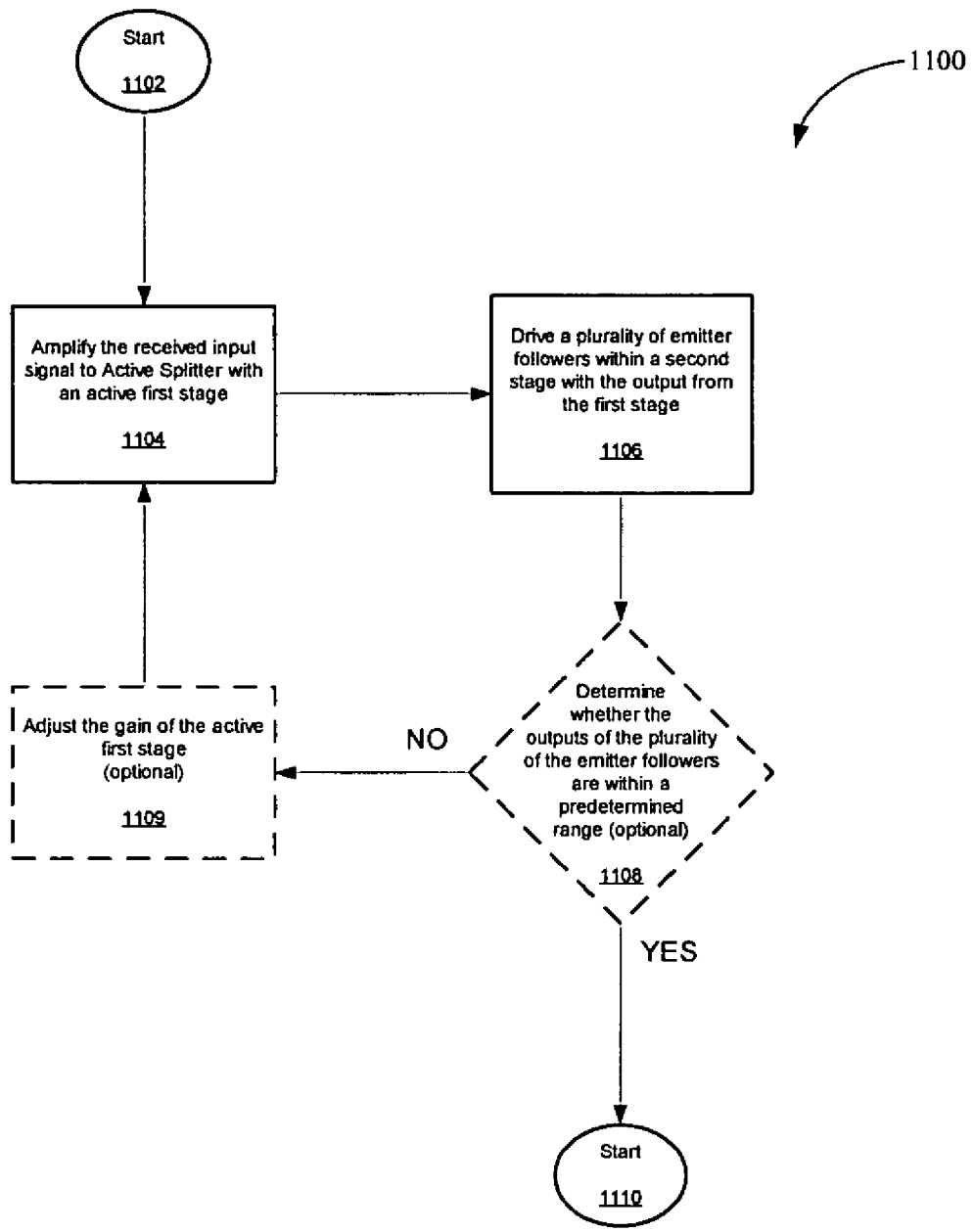
FIG. 11 is a flow-chart diagram showing the process preformed by the Active Splitter shown in FIG. 6 and FIG. 7.

FIG. 11 is a flow-chart diagram 1100 showing the process performed by the Active Splitters shown in both FIG. 6 and FIG. 7. The process starts at step 1102, when the first gain stage 604 amplifies the received input signal 602 to the Active Splitter 600 in step 1104. The Active Splitter 600 then drives a plurality of emitter followers 610, 612 and 614 within the second stage 606 with the output 662 from the first stage in step 1106. In response the emitter followers 610, 612 and 614 produce their respective outputs 670, 672 and 674 and the process ends in step 1110. However, if the Active Splitter 600 has the optional controller 676, the process may continue to optional determination step 1108 where the controller 676 determines whether the outputs 670, 672 and 674 of the plurality of the emitter followers 610, 612 and 614 are within a predetermined range. If the values of the outputs 670, 672 and 674 are within the predetermined range, the controller 676 allows the Active Splitter 600 to continue to operate without any modification and the process ends in step 1110.

If instead the values of the outputs 670, 672 and 674 are not within the predetermined range, the controller 676 then sends a control signal to the first gain stage 604 to adjust the gain of the first stage in step 1109. The first gain stage 604 then amplifies the received input signal 602 to the Active Splitter 600 with the adjusted gain in step 1104 and then drives the plurality of emitter followers 610, 612 and 614 the new output 662 from the first stage in step 1106. Again, in response the emitter followers 610, 612 and 614 produce their new respective outputs 670, 672 and 674 and the process returns to determination step 1108 where the controller 676 again determines whether the outputs 670, 672 and 674 of the plurality of the emitter followers 610, 612 and 614 are within a predetermined range. If the values of the outputs 670, 672 and 674 are within the predetermined range, the controller 676 allows the Active Splitter 600 to continue to operate without any modification and the process ends in step 1110.

If instead the values of the outputs 670, 672 and 674 are not within the predetermined range, the controller 676 then again sends a control signal to the first gain stage 604 to adjust the gain of the first stage in step 1109 and the process continues in the same fashion until it ends in step 1110.

Figure 12:
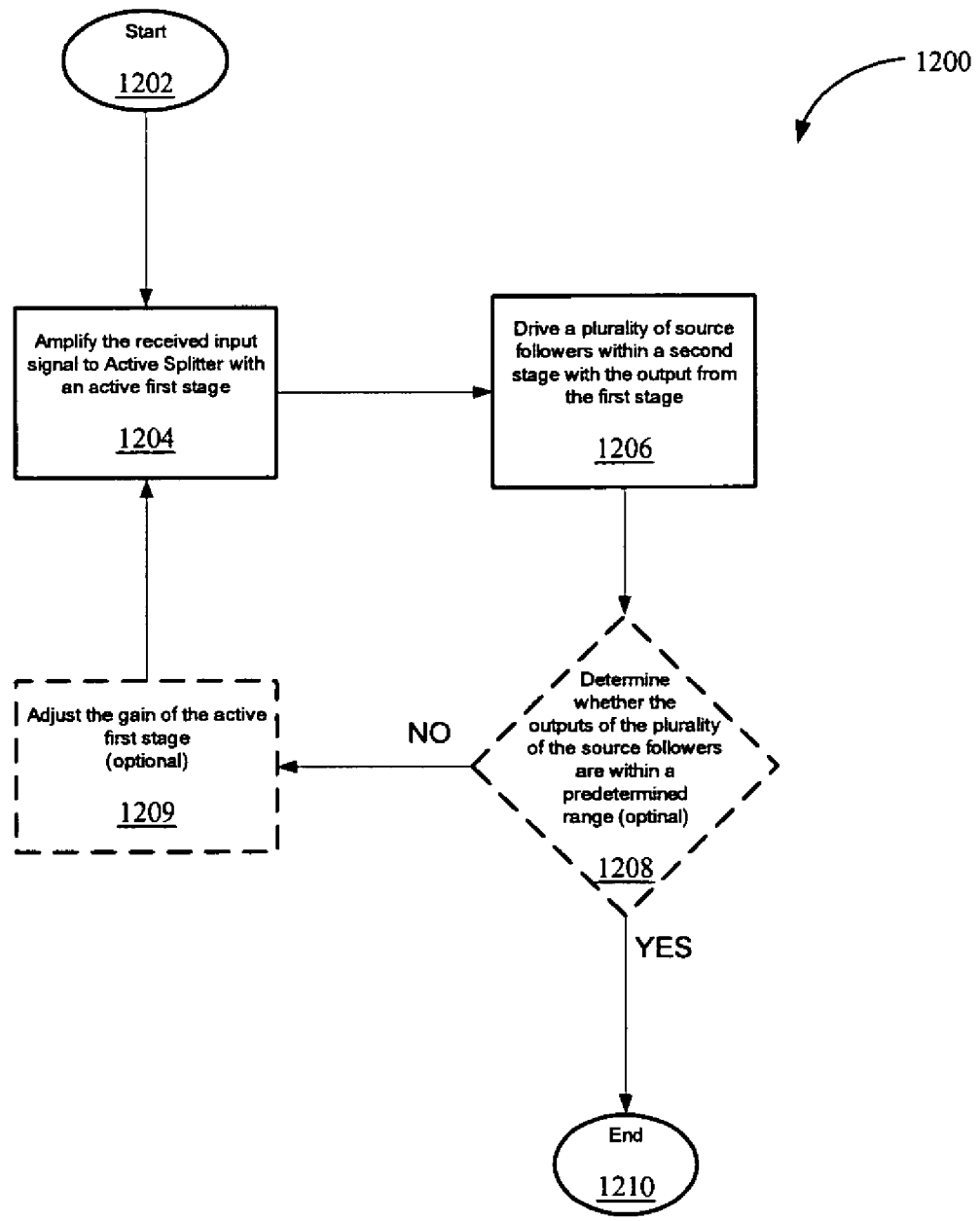
FIG. 12 is a flow-chart diagram showing the process preformed by the Active Splitter shown in FIG. 8.

Similarly, FIG. 12 is a flow-chart diagram showing the process performed by the Active Splitter 800 shown in FIG. 8. The process starts 1202, when the first gain stage 804 amplifies the received input signal 802 to the Active Splitter 800 in step 1204. The Active Splitter 800 then drives the plurality of source followers 810, 812 and 814 within the second stage 806 with the output 862 from the first stage in step 1206. In response the source followers 810, 812 and 814 produce their respective outputs 870, 872 and 874 and the process ends in step 1210. However, if the Active Splitter 800 has the optional controller 876, the process may continue to optional determination step 1208 where the controller 876 determines whether the outputs 870, 872 and 874 of the plurality of the source followers 810, 812 and 814 are within a predetermined range. If the values of the outputs 870, 872 and 874 are within the predetermined range, the controller 876 allows the Active Splitter 800 to continue to operate without any modification and the process ends in step 1210.

If instead the values of the outputs 870, 872 and 874 are not within the predetermined range, the controller 876 then sends a control signal to the first gain stage 804 to adjust the gain of the first stage in step 1209. The first gain stage 804 then amplifies the received input signal 802 to the Active Splitter 800 with the adjusted gain in step 1204 and then drives the plurality of source followers 810, 812 and 814 the new output 862 from the first stage in step 1206. Again, in response the source followers 810, 812 and 814 produce their new respective outputs 870, 872 and 874 and the process returns to determination step 1208 where the controller 876 again determines whether the outputs 870, 872 and 874 of the plurality of the source followers 810, 812 and 814 are within a predetermined range. If the values of the outputs 870, 872 and 874 are within the predetermined range, the controller 876 allows the Active Splitter 800 to continue to operate without any modification and the process ends in step 1210.

If instead the values of the outputs 870, 872 and 874 are not within the predetermined range, the controller 876 then again sends a control signal to the first gain stage 804 to adjust the gain of the first stage in step 1209 and the process continues in the same fashion until it ends in step 1210.

The processes described in FIG. 11 and FIG. 12 may be performed by hardware or software. If the process is performed by software, the software may reside in software memory (not shown) in the controller 676, 776 or 876, in the Active Splitter 600, 700 or 800 and/or a removable memory medium (not shown). The software in memory may include an ordered listing of executable instructions for implementing logical functions (i.e., "logic" that may be implemented either in digital form such as digital circuitry or source code or in analog form such as analog circuitry or an analog source such an analog electrical, sound or video signal), may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples, i.e., "a non-exhaustive list" of the computer-readable medium, would include the following: an electrical connection ("electronic") having one or more wires, a portable computer diskette (magnetic), a RAM (electronic), a read-only memory ("ROM") (electronic), an erasable programmable read-only memory ("EPROM" or Flash memory) (electronic), an optical fiber ("optical"), and a portable compact disc read-only memory ("CDROM") (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the application have been described, it will be apparent to those of ordinary skill in the art that many more embodiments and implementations are possible that are within the scope of this invention. Accordingly, the invention is not to be restricted except in light of the attached claims and their equivalents. The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. An active splitter for splitting a received input signal into a plurality of split output signals, the active splitter comprising:
   a plurality of active circuits connected in parallel that produce the plurality of split output signals from the received input signal, wherein each active circuit of the plurality of active circuits is a voltage follower and produces a corresponding split output signal from the plurality of split output signals that is substantially similar to the received input signal; and
   a controller in signal communication with the plurality of active circuits for powering up and down the active circuits for forming one or more desired signal distribution paths from an input signal-carrying input to one or more output signal-carrying outputs.

2. The active splitter of claim 1, wherein the voltage follower includes an emitter follower.

3. The active splitter of claim 2, wherein the emitter follower includes a bipolar transistor.

4. The active splitter of claim 2, wherein the emitter follower includes a Darlington pair transistor.

5. The active splitter of claim 1, wherein the voltage follower includes a source follower.

6. The active splitter of claim 5, wherein source follower includes a Field Effect Transistor ("FET") transistor.

7. The active splitter of claim 6, wherein the FET transistor is a MOFSET transistor.

8. The active splitter of claim 6, wherein the FET transistor is a CMOS transistor.

9. The active splitter of claim 1, wherein the voltage follower includes a differential amplifier.

10. The active splitter of claim 1, wherein the controller communicates with the plurality of active circuits for controlling the electrical characteristics of the plurality of active circuits.

11. The active splitter of claim 10, wherein the controller is in signal communication with a plurality of switches in signal communication with the plurality of active circuits, wherein each switch of the plurality of switches is capable of switching a corresponding active circuit of the plurality of active circuits to a state of ON or OFF in response to a control signal from the controller.

12. The active splitter of claim 1, further including a first gain stage in signal communication with the plurality of active circuits, wherein the first gain stage
   receives the received input signal,
   produces an amplified signal from the received input signal, and
   passes the amplified signal to the plurality of active circuits.

13. The active splitter of claim 12, wherein the first gain stage includes at least one first gain stage active circuit that amplifies the received input signal.

14. The active splitter of claim 13, wherein the at least one first gain stage active circuit includes a common-emitter amplifier.

15. The active splitter of claim 14, wherein the common-emitter amplifier includes a bipolar transistor.

16. The active splitter of claim 15, wherein the common-emitter amplifier includes a Darlington pair transistor.

17. The active splitter of claim 13, wherein the at least one first gain stage active circuit includes a common-source amplifier.

18. The active splitter of claim 17, wherein the common-source amplifier includes a Field Effect Transistor ("FET") transistor.

19. The active splitter of claim 18, wherein the FET transistor is a MOSFET transistor.

20. The active splitter of claim 18, wherein the FET transistor is a CMOS transistor.

21. The active splitter of claim 18, wherein the at least one first gain stage active circuit includes a differential amplifier.

22. The active splitter of claim 13, wherein the controller is in signal communication with the first gain stage for controlling the at least one first gain stage active circuit.

23. The active splitter of claim 22, wherein the controller is in signal communication with the plurality of active circuits for controlling the electrical characteristics of the plurality of active circuits.

24. The active splitter of claim 23, wherein the controller is in signal communication with a plurality of switches in signal communication with the plurality of active circuits, wherein each switch of the plurality of switches is capable of switching a corresponding active circuit of the plurality of active circuits to a state of ON or OFF in response to a control signal from the controller.

25. The active splitter of claim 23, wherein the controller is capable of switching between the at least one first gain stage active circuit to the plurality of voltage followers.

26. A method for splitting an input signal into a plurality of output signals, with an active splitter, the method comprising:
receiving the input signal with a plurality of voltage followers connected in parallel;
controlling the plurality of voltage followers by powering one or more of the voltage followers up or down to form one or more desired signal distribution paths from an input signal-carrying input to one or more output signal-carrying outputs; and
producing the plurality of output signals with the plurality of voltage followers in accordance with the one or more formed signal distribution paths, wherein each voltage follower of the plurality of voltage followers produces a corresponding output signal of the plurality of output signals that is substantially similar to the input signal.

27. The method of claim 26, further including amplifying the input signal prior to the input signal being received by the plurality of followers.

28. The method of claim 27, further including:
determining the output values produced by the followers with a controller,
comparing the output values produced by the followers with the input signal to the followers; and
adjusting the amplification of the input signal with the controller based on the comparison of the output values produced by the followers and the input signal to the followers.

29. An active splitter for splitting an input signal into a plurality of output signals, with an active splitter, the active splitter comprising:
means for receiving the input signal with a plurality of voltage followers connected in parallel;
means for controlling the plurality of voltage followers by powering one or more of the voltage followers up or down to form one or more desired signal distribution paths from an input signal-carrying input to one or more output signal-carrying outputs; and
means for producing the plurality of output signals with the plurality of voltage followers in accordance with the one or more formed signal distribution paths, wherein each voltage follower of the plurality of voltage followers produces a corresponding output signal of the plurality of output signals that is substantially similar to the input signal.

30. The active splitter of claim 29, further including means for amplifying the input signal prior to its being split into a plurality of output signals.

31. The active splitter of claim 29, further including:
means for determining the output values produced by the followers with a controller;
means for comparing the output values produced by the followers with the input signal to the followers; and
means for adjusting the amplification of the input signal with the controller based on the comparison of the output values produced by the followers and the input signal to the followers.

32. The active splitter of claim 1 comprising a plurality of switches in signal communication with the controller and with the plurality of active circuits, wherein each switch is capable of switching a corresponding active circuit to a state of ON or OFF in response to a control signal from the controller.

33. The active splitter of claim 12, comprising a plurality of switches in signal communication with the controller and with the plurality of active circuits, wherein each switch is capable of switching a corresponding active circuit to a state of ON or OFF in response to a control signal from the controller.

34. The method of claim 26 wherein controlling the plurality of voltage followers comprises switching one or more of the voltage followers to a state of ON or OFF.

35. The active splitter of claim 29 wherein the controlling means comprises means for switching one or more of the voltage followers to a state of ON or OFF.

36. An active splitter for splitting a plurality of received input signals into a plurality of split output signals, the active splitter comprising:
a plurality of first active circuits connected in parallel and producing the plurality of split output signals from a first input signal of the plurality of received input signals, wherein each first active circuit produces a corresponding first split output signal from the plurality of split output signals that is substantially similar to the first input signal;
a plurality of second active circuits connected in parallel and producing the plurality of split output signals from a second input signal of the plurality of received input signals, wherein each second active circuit produces a corresponding second split output signal from the plurality of split output signals that is substantially similar to the second input signal; and
a first gain stage in signal communication with the plurality of first and second active circuits, wherein the first gain stage receives the plurality of received input signals, produces amplified signals from the plurality of received input signals, and passes the amplified signals to the plurality of first and second active circuits.

37. The active splitter of claim 36, further including a controller in signal communication with the plurality of first and second active circuits for powering up and down the first and second active circuits for forming one or more desired signal distribution paths from respective inputs carrying the first and second input signals to corresponding outputs carrying the first and second split output signals.

38. The active splitter of claim 37 comprising a plurality of switches in signal communication with the controller and with the plurality of first and second active circuits, wherein each switch is capable of switching a corresponding active circuit to a state of ON or OFF in response to a control signal from the controller.

39. The active splitter of claim 36, further including a controller that is in signal communication with the plurality of first and second active circuits for controlling the electrical characteristics of the plurality of first and second active circuits.

40. The active splitter of claim 39, wherein the controller is in signal communication with a plurality of switches in signal communication with the plurality of first and second active circuits, wherein each switch of the plurality of switches is capable of switching a corresponding active circuit of the plurality of first and second active circuits to a state of ON or OFF in response to a control signal from the controller.

41. The active splitter of claim 36, wherein the first gain stage includes at least one first gain stage active circuit that amplifies at least one of the received input signals.

42. The active splitter of claim 41, further including a controller in signal communication with the first gain stage for controlling the at least one first gain stage active circuit.

43. The active splitter of claim 42 wherein the controller is in signal communication with the plurality of first and second active circuits for controlling the electrical characteristics of the plurality of first and second active circuits.

44. The active splitter of claim 43 comprising a plurality of switches in signal communication with the controller and with the plurality of first and second active circuits, wherein each switch is capable of switching a corresponding active circuit to a state of ON or OFF in response to a control signal from the controller.

45. An active splitter for splitting a received input signal into a plurality of split output signals, the active splitter comprising:
- a plurality of active circuits connected in parallel that produce the plurality of split output signals from the received input signal, wherein each active circuit of the plurality of active circuits produces a corresponding split output signal from the plurality of split output signals that is substantially similar to the received input signal;
- a controller in signal communication with the plurality of active circuits for powering up and down the active circuits for forming one or more desired signal distribution paths from an input signal-carrying input to one or more output signal-carrying outputs; and
- a first gain stage in signal communication with the plurality of active circuits, wherein the first gain stage receives the received input signal, produces an amplified signal from the received input signal, and passes the amplified signal to the plurality of active circuits.

46. The active splitter of claim 45, wherein the first gain stage includes at least one first gain stage active circuit that amplifies the received input signal.

47. The active splitter of claim 46, wherein the at least one first gain stage active circuit includes a common-emitter amplifier.

48. The active splitter of claim 47, wherein the common-emitter amplifier includes a bipolar transistor.

49. The active splitter of claim 48, wherein the common-emitter amplifier includes a Darlington pair transistor.

50. The active splitter of claim 46, wherein the at least one first gain stage active circuit includes a common-source amplifier.

51. The active splitter of claim 50, wherein the common-source amplifier includes a Field Effect Transistor ("FET") transistor.

52. The active splitter of claim 51, wherein the FET transistor is a MOSFET transistor.

53. The active splitter of claim 51, wherein the FET transistor is a CMOS transistor.

54. The active splitter of claim 46, wherein the at least one first gain stage active circuit includes a differential amplifier.

55. The active splitter of claim 46, wherein the controller is in signal communication with the first gain stage for controlling the at least one first gain stage active circuit.

56. The active splitter of claim 55, wherein the controller is in signal communication with the plurality of active circuits for controlling the electrical characteristics of the plurality of active circuits.

57. The active splitter of claim 56, wherein each of the plurality of active circuits is a voltage follower.

58. The active splitter of claim 57, wherein the controller is capable of switching between the at least one first gain stage active circuit to the plurality of voltage followers.

59. The active splitter of claim 56, wherein the controller is in signal communication with a plurality of switches in signal communication with the plurality of active circuits, wherein each switch of the plurality of switches is capable of switching a corresponding active circuit of the plurality of active circuits to a state of ON or OFF in response to a control signal from the controller.

60. The active splitter of claim 59, wherein each of the plurality of active circuits is a voltage follower.

61. The active splitter of claim 45 comprising a plurality of switches in signal communication with the controller and with the plurality of active circuits, wherein each switch is capable of switching a corresponding active circuit to a state of ON or OFF in response to a control signal from the controller.

62. The active splitter of claim 45, wherein each of the plurality of active circuits is a voltage follower.

63. The active splitter of claim 62, wherein the voltage follower includes an emitter follower.

64. The active splitter of claim 63, wherein the emitter follower includes a bipolar transistor.

65. The active splitter of claim 63, wherein the emitter follower includes a Darlington pair transistor.

66. The active splitter of claim 62, wherein the voltage follower includes a source follower.

67. The active splitter of claim 66, wherein the source follower includes a Field Effect Transistor ("FET") transistor.

68. The active splitter of claim 67, wherein the FET transistor is a MOFSET transistor.

69. The active splitter of claim 67, wherein the FET transistor is a CMOS transistor.

70. The active splitter of claim 62, wherein the voltage follower includes a differential amplifier.

* * * * *